(12) United States Patent
Jang et al.

(10) Patent No.: US 11,489,092 B2
(45) Date of Patent: Nov. 1, 2022

(54) QUANTUM-DOT FILM, LED PACKAGE, QUANTUM-DOT LIGHT EMITTING DIODE AND DISPLAY DEVICE

(71) Applicant: LG Display Co., Ltd., Seoul (KR)

(72) Inventors: Kyung-Kook Jang, Paju-si (KR); Jong-Kwan Bin, Paju-si (KR); Seul-Gi Choi, Paju-si (KR); Tae-Yang Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 283 days.

(21) Appl. No.: 16/668,202

(22) Filed: Oct. 30, 2019

(65) Prior Publication Data

US 2020/0135984 A1    Apr. 30, 2020

(30) Foreign Application Priority Data

Oct. 30, 2018 (KR) .......................... 10-2018-0130768

(51) Int. Cl.
| | |
|---|---|
| *H01L 33/50* | (2010.01) |
| *G02F 1/1335* | (2006.01) |
| *H01L 51/50* | (2006.01) |
| *H01L 27/32* | (2006.01) |
| *H01L 51/52* | (2006.01) |
| *C09K 11/06* | (2006.01) |
| *C09K 11/88* | (2006.01) |
| *C09K 11/70* | (2006.01) |
| *C09K 11/56* | (2006.01) |
| *G02F 1/13357* | (2006.01) |
| *H01L 51/00* | (2006.01) |

(Continued)

(52) U.S. Cl.
CPC ............ *H01L 33/502* (2013.01); *C09K 11/06* (2013.01); *C09K 11/565* (2013.01); *C09K 11/70* (2013.01); *C09K 11/883* (2013.01); *G02F 1/133603* (2013.01); *H01L 27/322* (2013.01); *H01L 27/3248* (2013.01); *H01L 33/507* (2013.01); *H01L 51/502* (2013.01); *H01L 51/504* (2013.01); *H01L 51/5253* (2013.01); *G02F 1/1368* (2013.01); *G02F 1/133512* (2013.01); *G02F 1/133614* (2021.01); *H01L 51/0003* (2013.01); *H01L 51/005* (2013.01); *H01L 51/56* (2013.01); *H01L 2251/558* (2013.01)

(58) Field of Classification Search
CPC ..... H01L 33/502; C09K 11/06; C09K 11/565; C09K 11/70; G02F 1/133603
See application file for complete search history.

(56) References Cited

U.S. PATENT DOCUMENTS 9,666,766 B2 *   5/2017   Kurtin .................. C09K 11/025
9,755,188 B2 *   9/2017   Choi ..................... H01L 51/5275
(Continued)

FOREIGN PATENT DOCUMENTS

KR    10-1018111 B1    2/2011
KR    10-2018-0031845 A    3/2018

*Primary Examiner* — Tracie Y Green
(74) *Attorney, Agent, or Firm* — Polsinelli PC

(57) ABSTRACT

A quantum-dot (QD) film, which includes a first QD layer including a first QD; and a first protection layer on the first QD layer and including a first organic compound, wherein the first organic compound includes at least two thiol groups, and a first one of the at least two thiol groups is anchored to the first QD, and an LED package, a QD light emitting diode and a display device including the QD film are provided.

33 Claims, 8 Drawing Sheets

(51) Int. Cl.
  *G02F 1/1368* (2006.01)
  *H01L 51/56* (2006.01)

(56) References Cited

U.S. PATENT DOCUMENTS

| | | | |
|---|---|---|---|
| 10,061,151 B2* | 8/2018 | Shin | H01L 51/5284 |
| 2013/0214249 A1* | 8/2013 | Pan | H01L 51/0043 |
| | | | 257/13 |
| 2015/0378182 A1* | 12/2015 | Shin | H01L 29/7869 |
| | | | 257/40 |
| 2016/0233449 A1* | 8/2016 | Murayama | C09K 11/883 |
| 2016/0264820 A1* | 9/2016 | Kikuchi | B32B 17/00 |
| 2017/0155088 A1* | 6/2017 | Kim | H01L 27/3276 |
| 2017/0255054 A1* | 9/2017 | Li | G02F 1/133617 |
| 2017/0317246 A1* | 11/2017 | Kang | C08K 3/346 |
| 2018/0108842 A1* | 4/2018 | Li | G03F 7/162 |
| 2019/0155094 A1* | 5/2019 | Kim | G02F 1/1339 |
| 2020/0235326 A1* | 7/2020 | Rahmati | H01L 51/502 |
| 2020/0407627 A1* | 12/2020 | Zhou | C09K 11/883 |
| 2020/0411719 A1* | 12/2020 | Kimoto | H05B 33/14 |
| 2021/0024823 A1* | 1/2021 | Nakata | H01L 51/5004 |

\* cited by examiner

QUANTUM-DOT FILM, LED PACKAGE, QUANTUM-DOT LIGHT EMITTING DIODE AND DISPLAY DEVICE

CROSS REFERENCE TO RELATED APPLICATION

This application claims priority to and the benefit of Republic of Korea Patent Application No. 10-2018-0130768 filed on Oct. 30, 2018, which is hereby incorporated by reference in its entirety.

BACKGROUND

Field of the Disclosure

The present disclosure relates to a quantum-dot (QD), and more particularly, to a QD film, a light emitting diode (LED) package, a QD light emitting diode (QLED) and a display device being capable of preventing damages and emitting efficiency decrease of the QD.

Description of the Background

Recently, as society has entered in earnest upon an information age, a field of display devices that represent all sorts of electrical signals as visual images has been developed rapidly. For example, a flat panel display device, such as a liquid crystal display (LCD) device, a plasma display panel (PDP) device, a field emission display (FED) device, and an organic light emitting diode (OLED) device, has been introduced.

On the other hand, use of quantum-dots (QD) to display devices has been researched or studied.

In the QD, an electron in unstable state transitions from a conduction band to a valence band such that light is emitted. Since the QD has a high extinction coefficient and excellent quantum yield, strong fluorescent light is emitted from the QD. In addition, since the wavelength of the light from the QD is controlled by a size of the QD, entire visible light can be emitted by controlling the size of the QD.

However, the QD is easily damaged by moisture and/or oxygen such that the emitting efficiency of the QD is decreased.

In addition, when the QD is coated in a multi-layered structure by a solution process, a lower layer is damaged by a solvent for forming an upper layer.

SUMMARY

Accordingly, the present disclosure is directed to a QD film, a light emitting diode (LED) package, a QD light emitting diode (QLED) and a display device that substantially obviate one or more of the problems due to limitations and disadvantages of the prior art, and have other advantages.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a quantum-dot (QD) film includes a first QD layer including a first QD; and a first protection layer on the first QD layer and including a first organic compound, wherein the first organic compound includes at least two thiol groups, and a first one of the at least two thiol groups is anchored to the first QD.

In one aspect, a light emitting diode (LED) package includes an LED chip; and a QD film covering the LED chip, the QD film including: a first QD layer including a first QD; and a first protection layer on the first QD layer and including a first organic compound, wherein the first organic compound includes at least two thiol groups, and a first one of the at least two thiol groups is anchored to the first QD.

In one aspect, a liquid crystal display device includes a liquid crystal panel; and an LED package positioned under the liquid crystal panel and including an LED chip and a QD film covering the LED chip, the QD film including: a first QD layer including a first QD; and a first protection layer on the first QD layer and including a first organic compound, wherein the first organic compound includes at least two thiol groups, and a first one of the at least two thiol groups is anchored to the first QD.

In one aspect, a liquid crystal display device includes a liquid crystal panel; a backlight unit positioned under the liquid crystal panel and including a light source; and a QD film positioned between the liquid crystal panel and the backlight unit, the QD film including: a first QD layer including a first QD; and a first protection layer on the first QD layer and including a first organic compound, wherein the first organic compound includes at least two thiol groups, and a first one of the at least two thiol groups is anchored to the first QD.

In one aspect, a QD light emitting diode includes a first electrode; a second electrode facing the first electrode; and a first emitting material layer positioned between the first and second electrodes and including a first QD layer includes a first QD and a first protection layer on the first QD layer, wherein the first protection layer includes a first organic compound, and wherein the first organic compound includes at least two thiol groups, and a first one of the at least two thiol groups is anchored to the first QD.

In one aspect, a display device includes a substrate; a QD light emitting diode positioned over the substrate and including a first electrode, a second electrode facing the first electrode, and a first emitting material layer positioned between the first and second electrodes and including a first QD layer includes a first QD and a first protection layer on the first QD layer; and a thin film transistor positioned between the substrate and the QD light emitting diode and connected to the QD light emitting diode, wherein the first protection layer includes a first organic compound, and wherein the first organic compound includes at least two thiol groups, and a first one of the at least two thiol groups is anchored to the first QD.

In one aspect, a display device includes a substrate including first to third pixel regions; an emitting diode over the substrate; a color filter layer positioned over the emitting diode and including a first color filter pattern in the first pixel region; and a first color conversion layer positioned between the first color filter pattern and the emitting diode in the first pixel region and including a first QD layer and a first protection layer on the first QD layer, wherein the first QD layer includes a first QD, and the first protection layer includes a first organic compound, and wherein the first organic compound includes at least two thiol groups, and one of the at least two thiol groups is anchored to the first QD.

It is to be understood that both the foregoing general description and the following detailed description are examples and are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this disclosure, illustrate aspects of the disclosure and together with the description serve to explain the principles of the disclosure.

In the drawings.

DETAILED DESCRIPTION

Reference will now be made in detail to aspects of the disclosure, examples of which are illustrated in the accompanying drawings.

Figure 1:
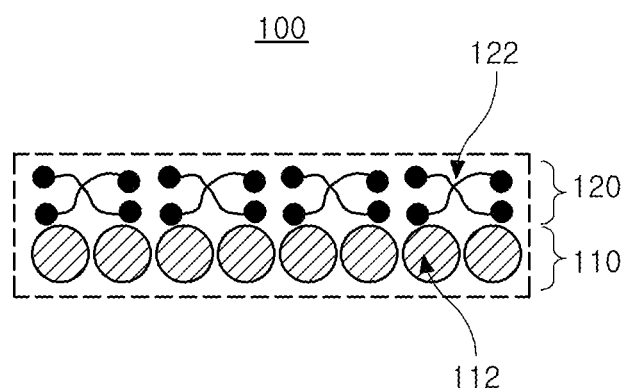
FIG. 1 is a schematic cross-sectional view of a QD film according to a first aspect of the present disclosure.

FIG. 1 is a schematic cross-sectional view of a QD film according to a first aspect of the present disclosure.

As shown in FIG. 1, a QD film 100 includes a QD layer 110 including a QD 112 and a protection layer 120 at a side (or a surface) of the QD layer 110 and including an organic compound 122 having at least two thiol groups. In this instance, one of the at least two thiol groups is anchored to the QD 112.

Although not shown, the QD 112 includes a core, which is positioned at a center of the QD 112 and emits light, and a shell enclosing the core. In addition, the QD 112 may further include a ligand combined (or connected) to a surface of the shell.

The core and the shell have a difference in an energy band gap. Each of the core and the shell includes a nano-size semiconductor material of II-VI group element or III-V group element. For example, the nano-size semiconductor material may be one of CdSe, CdS, CdTe, ZnSe, ZnTe, ZnS, HgTe, InAs, InP and GaAs.

The ligand may be a compound of C1 to C30 alkyl. The QD 112 may be dispersed in the non-polar solvent by the ligand.

The protection layer 120 covers the side of the QD layer 110 and includes the organic compound 122. The organic compound 112 includes at least two thiol groups and a linker including an ether bond or an ester bond. The thiol groups are connected to each other by the linker. For example, the organic compound 112 may be selected from materials in Formula 1.

[Formula 1]

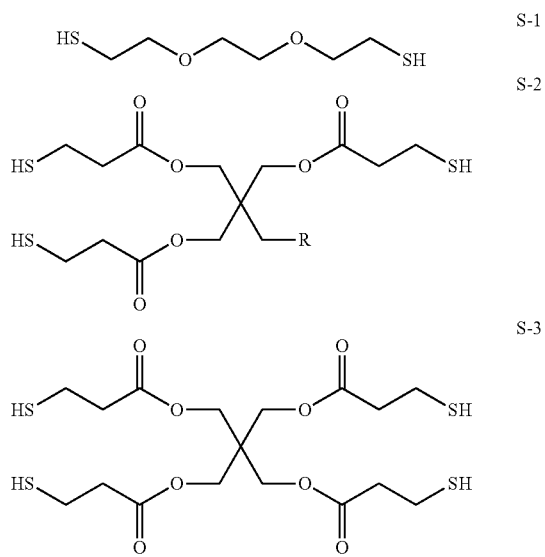

In Formula 1, R is selected from C1 to C 30 alkyl group. For example, R may be methyl.

Namely, the organic compound 122 in the protection layer 120 has two to fourth thiol groups. The thiol groups are connected to each other by an ether group (an ether linker) as the compound S-1 or an ester group (an ester linker) as the compounds S-2 and S-3.

Since the organic compound 122 includes the thiol group having high bonding strength to the QD 112, the thiol group is anchored to the QD 112. As a result, the protection layer 120 is securely formed on the QD layer 110.

Figure 2:
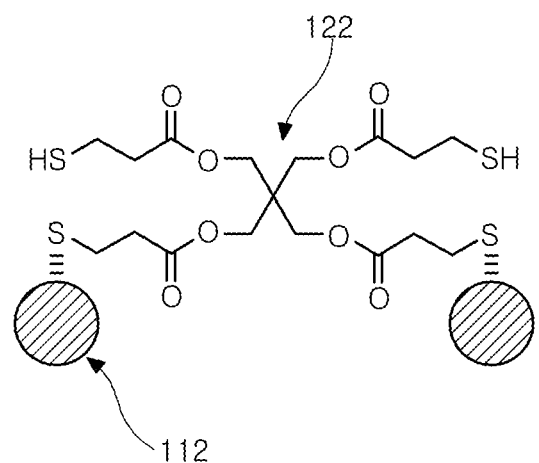
FIG. 2 is a schematic view for explaining an anchoring state of a thiol-group in a protection layer to a QD in a QD film according to the present disclosure.

Referring to FIG. 2, which is a schematic view for explaining an anchoring state of a thiol-group in a protection layer to a QD in a QD film according to the present disclosure, the thiol group in the organic compound of the compound S-3 in Formula 1 is anchored to the QD 112, the protection layer 120 is securely formed on the QD layer 110.

The anchoring state of the thiol group to the QD 112 means that the thiol group may be chemically or physically connected (combined or bonded) to the QD 112. For example, the thiol group may be combined to a surface of the shell of the QD 112 such that the thiol group may serve as a ligand in the QD 112. (ligand exchange)

Since the organic compound 122 in the protection layer 120 includes the ether group or the ester group, the penetration of moisture and/or oxygen is prevented. Accordingly, the damage on the QD 112 by the moisture and/or oxygen is also prevented.

Figure 3:
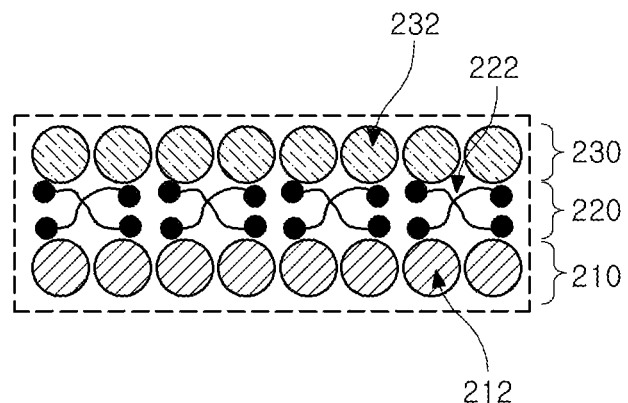
FIG. 3 is a schematic cross-sectional view of a QD film according to a second aspect of the present disclosure.

FIG. 3 is a schematic cross-sectional view of a QD film according to a second aspect of the present disclosure.

As shown in FIG. 3, a QD film 200 includes a first QD layer 210 including a first QD 212, a first protection layer 220 on a side of the first QD layer 210 including a first organic compound 222, and a second QD layer 230 on a side of the protection layer 220 and including a second QD 232. The first organic compound 222 in the first protection layer 220 includes at least two thiol groups. In this instance, one of the at least two thiol groups is anchored to the first QD 212. The other one of the at least two thiol groups may be anchored to the second QD 232.

The first and second QDs 212 and 232 may emit lights having same wavelength. For example, to increase amount of the QDs in the QD film 200, the first and second QD layers 210 and 230 including the same QDs 212 and 232 may be stacked to form a multi-layered structure QD film 200.

Alternatively, the first and second QDs 212 and 232 may emit lights having different wavelengths. For example, one of the first and second QDs 212 and 232 may be a red QD emitting red light, and the other one of the first and second QDs 212 and 232 may be a green QD emitting green light.

The first protection layer 220 is positioned between the first and second QD layers 210 and 230. The first organic compound 222 in the first protection layer 220 includes at least two thiol groups and a linker including an ether bond or an ester bond. The thiol groups are connected to each other by the linker. For example, the first organic compound 212 may be selected from the materials in Formula 1.

As mentioned above, since the first organic compound 222 includes the thiol group having high bonding strength to the first QD 212, the thiol group is anchored to the first QD 212. As a result, the first protection layer 220 is securely formed on the first QD layer 210. In addition, since the thiol group in the first organic compound 222 is anchored to the second QD 232 in the second QD layer 230, the second QD layer 230 is securely formed on the first protection layer 220.

Since the first organic compound 222 in the first protection layer 220 includes the ether group or the ester group, the penetration of moisture and/or oxygen is prevented. Accordingly, the damage on the first QD 212 and/or the second QD 232 by the moisture and/or oxygen is also prevented.

In addition, since the first QD layer 210 is protected by the first protection layer 220, the damage on the first QD layer 210 by a solvent for forming the second QD layer 230 is prevented.

Namely, when the first and second QD layers 210 and 230 are formed by a solution process using a non-polar solvent, e.g., hexane solvent, without the first protection layer 220, the first QD layer 210 is exposed to the non-polar solvent in the solution process for the second QD layer 230. As a result, the first QD 212 may be removed from the first QD layer 210.

However, in the QD film 200 of the present disclosure, since the second QD layer 230 is formed over the first QD layer 210 with the first protection layer 220, which is formed using a polar solvent and covers the first QD layer 210, the damage of the first QD layer 210 is prevented. Accordingly, the QD film 200 including a multi-layered structure and high emitting efficiency without damages on the QD is provided.

Although not shown, a second protection layer including a second organic compound may be formed on the second QD layer 230. The second organic compound may be selected from the materials in Formula 1, and the damage on the second QD 232 by moisture and/or oxygen may be further prevented.

[QD Film]

1. COMPARATIVE EXAMPLE 1 (REF1)

A QD solution including a QD (InP/ZnSe/ZnS, 50wt %) dispersed in a hexane solvent is spin-coated on a glass substrate by 3000 rpm for 60 seconds to form a QD film.

2. COMPARATIVE EXAMPLE 2 (REF2)

A hexane solvent is further coated on the QD film in Comparative Example 1.

3. EXAMPLE 1 (EX1)

After mixing the compound S-3 (50wt %) in Formula 1 to an ethanol solvent, the solution is spin-coated on the QD film in Comparative Example 1 by 3000 rpm for 60 seconds to form a protection layer. Then, a QD solution including a QD (InP/ZnSe/ZnS, 50wt %) dispersed in a hexane solvent is coated on the protection layer.

Figure 4:
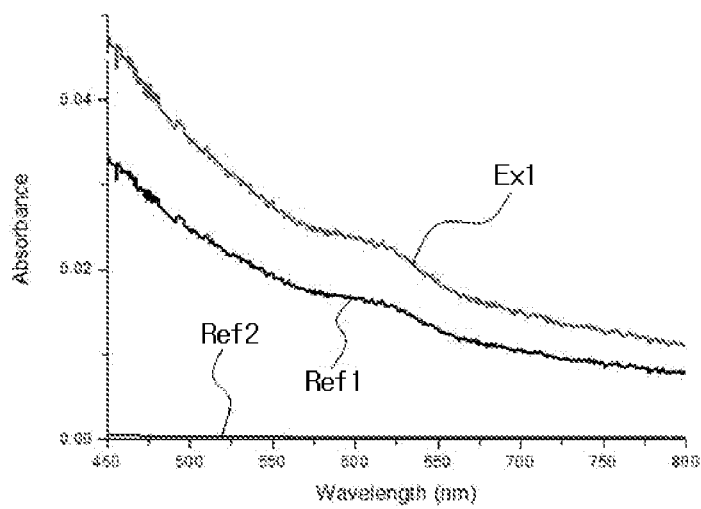
FIG. 4 is a graph showing a light absorption property of a multi-layered structure QD film according to the present disclosure.

A light absorption property of a multi-layered structure QD film of Comparative Examples 1 and 2 and Example 1 is measured and shown in FIG. 4.

As shown in FIG. 4, in the QD film of Comparative Example 2, there is no light absorption by the QD because the QDs are removed by the hexane solvent. On the other hand, since the QD film of Example 1 has a multi-layered structure, the light absorption by the QD in the QD film of Example 1 is significantly increased in comparison to the QD film of Comparative Example 1.

The light emission amount (intensity) from the QD film may be proportional to the light absorption amount by the QD film. There is a limitation of the light absorption amount in a single-layered QD film. However, when a multi-layered structure QD film is formed to increase the light absorption amount, a lower QD layer is damaged by a solvent for forming an upper QD layer such that the light absorption amount (light emission amount) of the QD film is decreased.

However, in the QD film of the present disclosure, since the upper QD layer (the second QD layer) is formed after the protection layer, which includes the organic compound having the thiol groups, is formed on the lower QD layer (the first QD layer), the multi-layered structure QD film without damages on the lower QD layer is provided.

Figure 5:
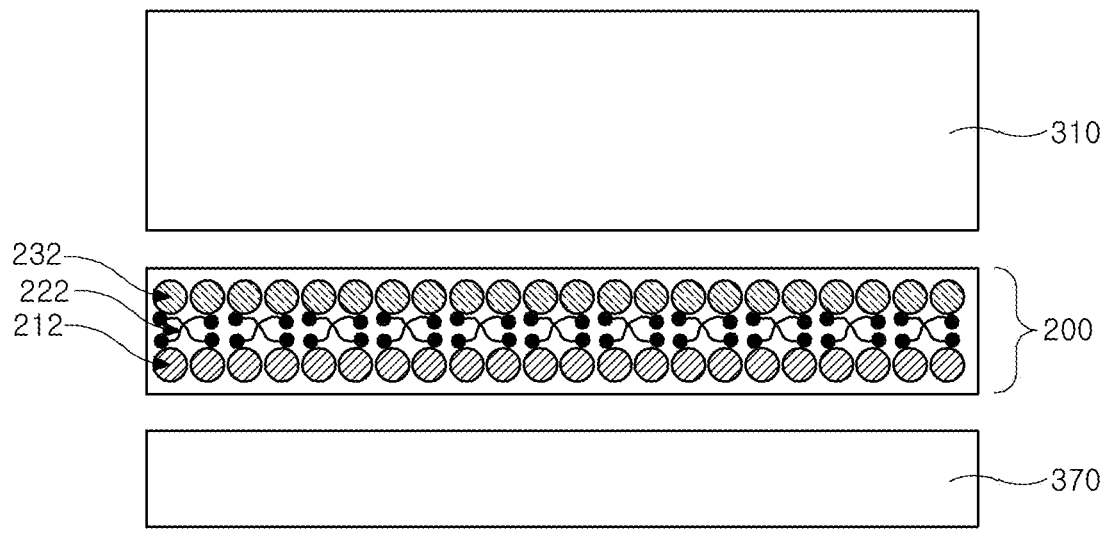
FIG. 5 is a schematic cross-sectional view of a liquid crystal display (LCD) device according to a third aspect of the present disclosure.
Figure 6:
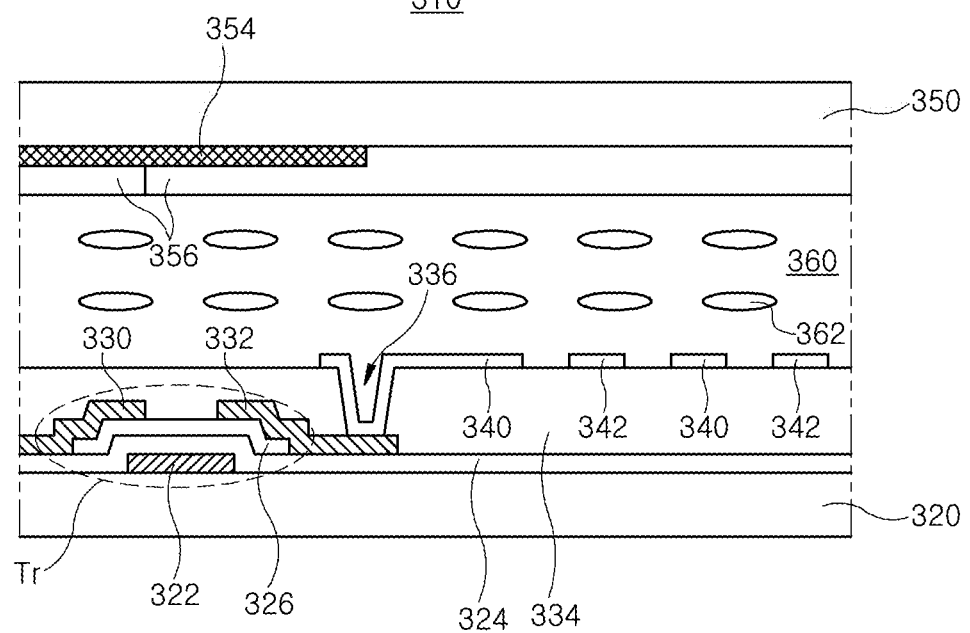
FIG. 6 is a schematic cross-sectional view of a display panel in FIG. 5.

FIG. 5 is a schematic cross-sectional view of a liquid crystal display (LCD) device according to a third aspect of the present disclosure, and FIG. 6 is a schematic cross-sectional view of a display panel in FIG. 5.

As shown in FIG. 5, an LCD device 300 as a display device of the present disclosure includes a liquid crystal panel 310, a backlight unit 370 under the liquid crystal panel 310 and a QD film 200 between the liquid crystal panel 310 and the backlight unit 370.

Referring to FIG. 6, the liquid crystal panel 310 includes first and second substrates 320 and 350 facing each other and a liquid crystal layer 360 including liquid crystal molecules 362 disposed between the first and second substrates 320 and 350.

A gate electrode 322 is formed on the first substrate 320, and a gate insulating layer 324 is formed to cover the gate electrode 322. In addition, a gate line (not shown) being connected to the gate electrode 322 is formed on the first substrate 320.

A semiconductor layer 326 corresponding to the gate electrode 322 is formed on the gate insulating layer 324. The semiconductor layer 326 includes an oxide semiconductor material. Alternatively, the semiconductor layer 326 may include an active layer of intrinsic amorphous silicon and an ohmic contact layer of impurity-doped amorphous silicon.

A source electrode 330 and a drain electrode 332 are formed on the semiconductor layer 326 to be spaced apart from each other. In addition, a data line (not shown), which is connected to the source electrode 330 and crosses the gate line to define a pixel region, is formed on the gate insulating layer 324.

The gate electrode 322, the semiconductor layer 326, the source electrode 330 and the drain electrode 332 constitute a thin film transistor (TFT) Tr.

A passivation layer 334, which includes a drain contact hole 336 exposing the drain electrode 332, is formed on the TFT Tr.

A pixel electrode 340, which is connected to the drain electrode 332 through the drain contact hole 336, and a common electrode 342, which is alternately arranged with the pixel electrode 340, are formed on the passivation layer 334.

A black matrix 354, shielding a non-display region, e.g., the TFT Tr, the gate line and the data line, is formed on the second substrate 350, and a color filter layer 356 corresponding to the pixel region is formed on the second substrate 350.

The first and second substrates 320 and 350 are attached with the liquid crystal layer 360 therebetween. The liquid crystal molecules 362 of the liquid crystal layer 360 are driven by an electric field between the pixel and common electrodes 340 and 342.

Although not shown, first and second alignment layers are formed over the first and second substrates 320 and 350 to be adjacent to the liquid crystal layer 360. In addition, first and second polarization plates, which have perpendicular transmission axes, are disposed at an outer side of the first and second substrates 320 and 350.

The backlight unit 370 includes a light source (not shown) and provides the light toward the liquid crystal panel 310.

The backlight unit 370 may be classified into a direct type and a side type according to a position of the light source, and the light source may be a fluorescent lamp or a light emitting diode (LED) package. The light source may emit light having short wavelength range of about 430 to 470 nm.

For example, the direct type backlight unit 370 may include a bottom frame (not shown) covering a rear side of the liquid crystal panel 310, and a plurality of light sources may be arranged on a horizontal bottom surface of the bottom frame.

The side type backlight unit 370 may include a bottom frame (not shown) covering a rear side of the liquid crystal panel 310 and a light guide plate (not shown) on or over a horizontal bottom surface of the bottom frame. The light source may be arranged at a side of the light guide plate.

The QD film 200 includes a first QD layer 210, a second QD layer 230 and a first protection layer 220. The first QD layer 210 is positioned between the liquid crystal panel 310 and the backlight unit 370 and includes a first QD 212. The second QD layer 230 is positioned between the first QD layer 210 and the liquid crystal panel 310 and includes a second QD 232. The first protection layer 220 is positioned between the first and second QD layers 210 and 230 and includes a first organic compound having at least two thiol groups. Although not shown, a second protection layer, which includes a second organic compound being same as the first organic compound and is positioned between the second QD layer 230 and the liquid crystal panel 310, may be further included in the QD film 200.

The first and second QDs 212 and 232 absorb the light from the backlight unit 370 and may respectively emit first and second wavelength lights having different wavelengths.

For example, one of the first and second wavelength lights may be a red light, and the other one of the first and second wavelength lights may be a green light. Namely, one of the first and second QDs 212 and 232 may be a red QD, and the other one of the first and second QDs 212 and 232 may be a green QD.

One part of the light from the light source of the backlight unit 370 may be converted into the first wavelength light by the first QD 212, and another part of the light from the light source of the backlight unit 370 may be converted into the second wavelength light by the second QD 232. Accordingly, the other part of the light from the light source of the backlight unit 370, the first wavelength light and the second wavelength light are mixed such that white light is provided.

In FIG. 5, the QD film 200 includes two QD layers 210 and 230. Alternatively, when the light source of the backlight unit provides blue light and red (or green) light, a single-layered QD film 100 (of FIG. 1) including a green (or red) QD 112 is included instead of the QD film 200.

The QD film 200 absorbs the light from the backlight unit 370 and provides high color purity light toward the liquid crystal panel 310 such that the display quality of the LCD device 300 is improved.

In addition, since the damage on the QDs 212 and 232 by moisture and/or oxygen is prevented by the organic compound 222 in the protection layer 220, the light efficiency decrease is prevented.

Moreover, since the QD film 200 has a multi-layered structure including the first and second QD layers 210 and 230 without the damage on the first QD layer 210 due to the protection layer 220, the LCD device 300 has advantages in the fabrication process, the production costs and a thin profile.

Figure 7:
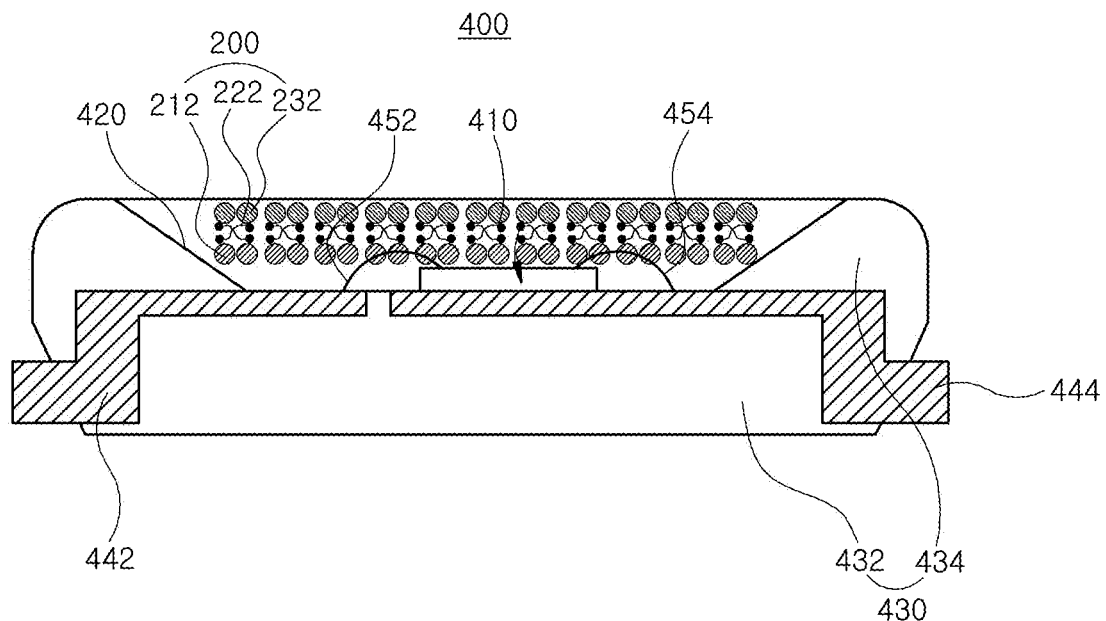
FIG. 7 is a schematic cross-sectional view of an LED package according to a fourth aspect of the present disclosure.

FIG. 7 is a schematic cross-sectional view of an LED package according to a fourth aspect of the present disclosure.

As shown in FIG. 7, the LED package 400 includes an LED chip 410 and a QD film 200 covering the LED chip 410.

The QD film 200 includes a first QD layer 210, a second QD layer 230 and a first protection layer 220. The first QD layer 210 is positioned between the liquid crystal panel 310 and the backlight unit 370 and includes a first QD 212. The second QD layer 230 is positioned between the first QD layer 210 and the liquid crystal panel 310 and includes a second QD 232. The first protection layer 220 is positioned between the first and second QD layers 210 and 230 and includes a first organic compound having at least two thiol groups. Although not shown, a second protection layer, which includes a second organic compound being same as the first organic compound and is positioned between the second QD layer 230 and the liquid crystal panel 310, may be further included in the QD film 200.

The LED chip 410 may emit light having short wavelength range of about 430 to 470 nm. Namely, the LED chip 410 may emit blue light.

The first and second QDs 212 and 232 absorb the light from the LED chip 410 and may respectively emit first and second wavelength lights having different wavelengths.

For example, one of the first and second wavelength lights may be a red light, and the other one of the first and second wavelength lights may be a green light. Namely, one of the first and second QDs 212 and 232 may be a red QD, and the other one of the first and second QDs 212 and 232 may be a green QD.

One part of the light from the LED chip 410 may be converted into the first wavelength light by the first QD 212, and another part of the light from the LED chip 410 may be converted into the second wavelength light by the second QD 232. Accordingly, the other part of the light from the LED chip 410, the first wavelength light and the second wavelength light are mixed such that white light is provided.

The LED package 400 may further includes a case 430, first and second electrode leads 442 and 444, which are respectively connected to the LED chip 410 via first and second wires 452 and 454 and extend into an outside of the case 430.

The case 430 includes a body 432 and a side wall 434 protruding from an upper surface of the body 432 and serving as a reflection surface. The LED chip 410 is arranged on the body 432 and is surrounded by the side wall 434.

For example, the LED package 400 may be used as a light source in a lightening device or an LCD device.

In FIG. 7, the QD film 200 includes two QD layers 210 and 230. Alternatively, when the red (or green) LED chip is provided with the blue LED chip 410, a single-layered QD film 100 (of FIG. 1) including a green (or red) QD 112 is included instead of the QD film 200.

As mentioned above, since the QDs 212 and 232 of the QD film 200 absorb the light from the LED chip 410 and respectively emit the first and second wavelength lights, high color purity white light is provided from the LED package 400.

In addition, since the damage on the QDs 212 and 232 by moisture and/or oxygen is prevented by the organic compound 222 in the protection layer 220, the light efficiency decrease is prevented.

Moreover, since the QD film 200 has a multi-layered structure including the first and second QD layers 210 and 230 without the damage on the first QD layer 210 due to the protection layer 220, the LED package 400 has advantages in the fabrication process, the production costs and a thin profile.

Figure 8:
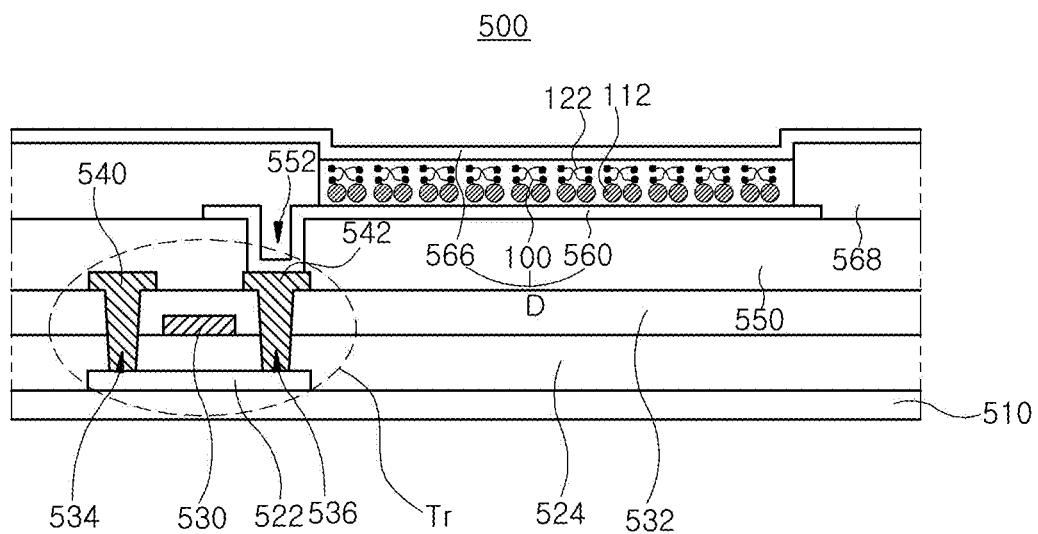
FIG. 8 is a schematic cross-sectional view of a QD display device according to a fifth aspect of the present disclosure.

FIG. 8 is a schematic cross-sectional view of a QD display device according to a fifth aspect of the present disclosure.

As shown in FIG. 8, a QD display device 500 as a display device of the present disclosure includes a substrate 510, a driving element Tr on or over the substrate 510 and a quantum-dot light emitting diode (QLED) D connected to the driving element Tr.

A semiconductor layer 522 is formed on the substrate 510. The semiconductor layer 522 may include an oxide semiconductor material or polycrystalline silicon.

When the semiconductor layer 522 includes the oxide semiconductor material, a light-shielding pattern (not shown) may be formed under the semiconductor layer 522. The light to the semiconductor layer 522 is shielded or blocked by the light-shielding pattern such that thermal degradation of the semiconductor layer 522 can be prevented. On the other hand, when the semiconductor layer 522 includes polycrystalline silicon, impurities may be doped into both sides of the semiconductor layer 522.

A first insulating layer 524, which may be referred to as a gate insulating layer, is formed on the semiconductor layer 522. The first insulating layer 524 may be formed of an inorganic insulating material such as silicon oxide or silicon nitride.

A gate electrode 530, which is formed of a conductive material, e.g., metal, is formed on the first insulating layer 524 to correspond to a center of the semiconductor layer 522.

A second insulating layer 532, which may be referred to as an interlayer insulating layer, is formed on an entire surface of the substrate 510 including the gate electrode 530. The second insulating layer 532 is formed of an insulating material. For example, the second insulating layer 532 may be formed of an inorganic insulating material, e.g., silicon oxide or silicon nitride, or an organic insulating material, e.g., benzocyclobutene or photo-acryl.

The second insulating layer 532 includes first and second contact holes 534 and 536 exposing both sides of the semiconductor layer 522. The first and second contact holes 534 and 536 are positioned at both sides of the gate electrode 530 to be spaced apart from the gate electrode 530.

A source electrode 540 and a drain electrode 542, which are formed of a conductive material, e.g., metal, are formed on the second insulating layer 532. The source electrode 540 and the drain electrode 542 are spaced apart from each other with respect to the gate electrode 530 and respectively contact both sides of the semiconductor layer 522 through the first and second contact holes 534 and 536.

The semiconductor layer 522, the gate electrode 530, the source electrode 540 and the drain electrode 542 constitute the TFT Tr as a driving element.

In FIG. 8, the gate electrode 530, the source electrode 540, and the drain electrode 542 are positioned over the semiconductor layer 522. Namely, the TFT Tr has a coplanar structure. Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, a gate line and a data line are disposed on or over the substrate 510 and cross each other to define a pixel region. In addition, a switching element, which is electrically connected to the gate line and the data line, may be disposed on the substrate 510. The switching element is electrically connected to the TFT Tr as the driving element.

In addition, a power line, which is parallel to and spaced apart from the gate line or the data line, may be formed on or over the substrate 510. Moreover, a storage capacitor for maintaining a voltage of the gate electrode 530 of the TFT Tr during one frame, may be further formed on the substrate 510.

A third insulating layer 550, which includes a drain contact hole 552 exposing the drain electrode 542 of the TFT Tr, is formed to cover the TFT Tr. The third insulating layer 550 may be referred to as a passivation layer.

A first electrode 560, which is connected to the drain electrode 542 of the TFT Tr through the drain contact hole 552, is separately formed in each pixel region and on the third insulating layer 550. The first electrode 560 may be an anode and may be formed of a conductive material having a relatively high work function. For example, the first electrode 560 may be formed of a transparent conductive material such as indium-tin-oxide (ITO) or indium-zinc-oxide (IZO).

When the QD display device 500 is operated in a top-emission type, a reflection electrode or a reflection layer may be formed under the first electrode 560. For example, the reflection electrode or the reflection layer may be formed of aluminum-palladium-copper (APC) alloy.

A bank layer 568, which covers edges of the first electrode 560, is formed on the third insulating layer 550. A center of the first electrode 560 in the pixel region is exposed through an opening of the bank layer 568.

A QD film 100 including a QD layer 110 and a protection layer 120 on the QD layer 110 is formed on the first electrode 560. The QD layer 110 includes a QD 112, and the protection layer 120 includes an organic compound having at least two thiol groups. The organic compound may be selected from the materials of Formula 1. The QD film 100 in the QD display device 500 may be referred to as an emitting layer or an emitting material layer.

The QD 112 of the QD film 100 in a red pixel region is a red QD, the QD 112 of the QD film 100 in a green pixel region is a green QD, and the QD 112 of the QD film 100 in a blue pixel region is a blue QD.

A second electrode 566 is formed over the substrate 510 including the QD film 100. The second electrode 566 is positioned at an entire surface of the display area. The second electrode 566 may be a cathode and may be formed of a conductive material having a relatively low work function. For example, the second electrode 566 may be formed of aluminum (Al), magnesium (Mg) or Al-Mg alloy.

The first electrode 560, the QD film 100 and the second electrode 566 constitute the QLED D. In the QLED D, the first electrode 560 is positioned to be closer to the TFT Tr than the second electrode 566 and connected to the TFT Tr. Alternatively, the second electrode may be positioned to be closer to the TFT than the first electrode and connected to the TFT.

The hole from the first electrode 560 and the electron from the second electrode 566 are injected into the QD film 100, the light is emitted from the QD 112 of the QD film 100. Namely, the QD film 100 serves as an emitting material layer (EML).

A single-layered QD film 100 is shown in FIG. 8. Alternatively, a multi-layered QD film 200 (of FIG. 3) may be used as the emitting material layer instead of the QD film 100. In this instance, the QD 212 (of FIG. 3) in the first QD layer 210 (of FIG. 3) and the QD 232 (of FIG. 3) in the second QD layer 230 (of FIG. 3) provide the same color light.

Although not shown, a hole auxiliary layer including at least one of a hole injection layer (HIL) and a hole transporting layer (HTL) may be sequentially disposed between the first electrode 560 and the QD film 100, and an electron auxiliary layer including at least one of an electron transporting layer (ETL) and an electron injection layer (EIL) may be sequentially disposed between the QD film 100 and the second electrode 566.

In the QD display device 500, since the damage on the QDs 212 and 232 by moisture and/or oxygen is prevented by the organic compound 222 in the protection layer 220, the light efficiency decrease is prevented.

In addition, when the QD film 200 has a multi-layered structure including the first and second QD layers 210 and 230 is included in the QD display device 500, the multi-layered structure is provided without the damage on the first QD layer 210 due to the protection layer 220. Accordingly, the light efficiency of the QD display device 500 is further improved.

[Quantum-Dot Light Emitting Diode]

1. COMPARATIVE EXAMPLE 3 (REF3)

After PEDOT:PSS is coated on a glass substrate including an ITO layer (anode) to form the HIL (about 30 nm), polyvinylcarbazole (PVK) is coated to form the HTL (about 25 nm). A hexane solution, where the QD (InP/ZnSe/ZnS, 15 mg/l) is dispersed, is coated by 3000 rpm for 45 seconds to form the QD layer (about 10 nm) as the EML. The HTL (ZnO, about 40 nm) and the cathode (Al) are sequentially formed on the EML.

2. EXAMPLE 2 (EX2)

Before forming the HTL and the cathode, the ethanol solution, where the compound S-3 (50wt %) of Formula 1 is dissolved, is coated by 3000 rpm for 45 seconds to form the protection layer (about 3nm) on the EML.

Figure 9:
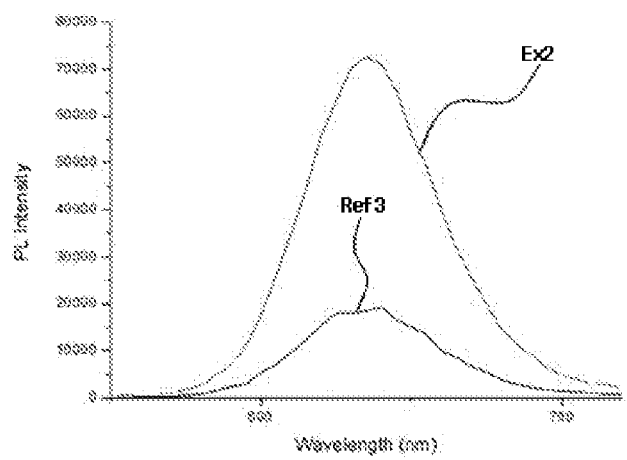
FIG. 9 is a graph showing an emission property of a QD display device.
Figure 10:
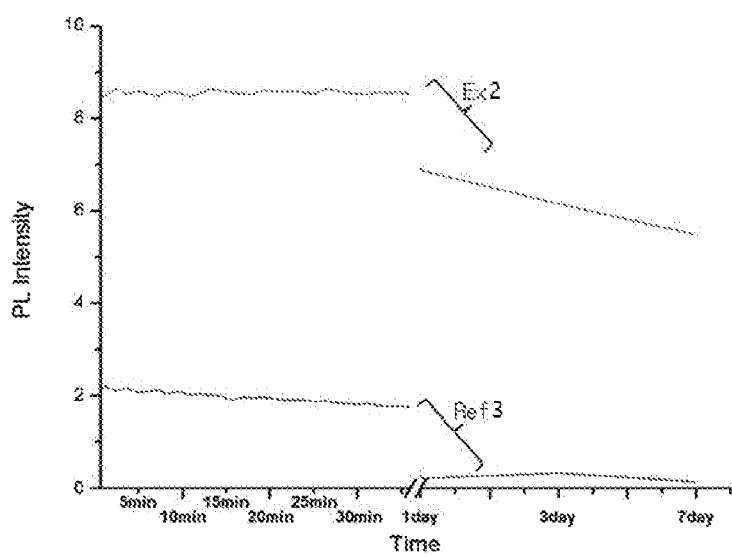
FIG. 10 is a graph showing an emission stability of a QD display device.

The emitting property of the QLED in Comparative Example 3 and Example 2 are measured and shown in FIGS. 9 and 10.

Referring to FIG. 9, which shows an initial emitting property (performance), in comparison to the QLED in Comparative Example 3, the QLED in Example 2 provides high PL intensity. In the QLED in Example 2, since the penetration of moisture and/or oxygen is prevented by the protection layer, in which the organic compound includes the thiol group and the ester group, the damage of the QD is prevented and the emitting property (PL intensity) is improved.

Referring to FIG. 10, the emitting performance (PL intensity) of the QLED in Comparative Example 3 is significantly degraded. However, the degradation in emitting performance of the QLED in Example 2 is decreased.

Figure 11:
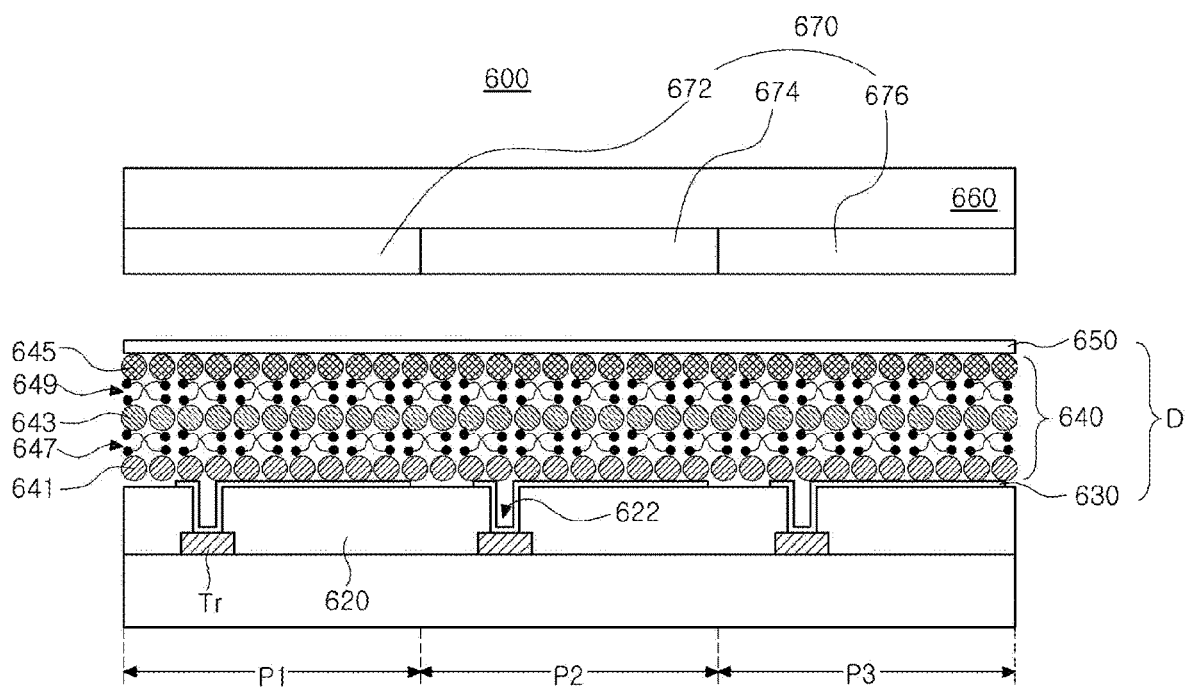
FIG. 11 is a schematic cross-sectional view of a QD display device according to a sixth aspect of the present disclosure.

FIG. 11 is a schematic cross-sectional view of a QD display device according to a sixth aspect of the present disclosure.

As shown in FIG. 11, a QD display device 600 includes a first substrate 610, where first to third pixel regions P1 to P3 are defined, a QLED D over the first substrate 610, and a color filter layer 670 on or over the QLED D. For example, the first pixel region P1 may be a red pixel region, the second pixel region P2 may be a green pixel region, and the third pixel region P3 may be a blue pixel region.

The QD display device 600 may further include a TFT Tr, which is positioned between the first substrate 610 and the QLED D and connected to the QLED D, and a second substrate 660 at an outer side of the color filter layer 670. In this instance, the color filter layer 670 may be formed on an inner surface of the second substrate 660.

Although not shown, the TFT Tr includes a semiconductor layer, a gate electrode, a source electrode and a drain electrode.

An insulating layer 620, which includes a drain contact hole 622 exposing the drain electrode, is formed on the TFT Tr. For example, the insulating layer 620 may be formed of an inorganic insulating material or an organic insulating material.

A first electrode 630, which is connected to the drain electrode of the TFT Tr through the drain contact hole 622, is separately formed in each of the first to third pixel regions P1 to P3 and on the insulating layer 620. The first electrode 630 may be an anode and may be formed of a conductive material having a relatively high work function. For example, the first electrode 630 may be formed of a transparent conductive material such as indium-tin-oxide (ITO) or indium-zinc-oxide (IZO).

Although not shown, a reflection electrode or a reflection layer may be formed under the first electrode 630. For example, the reflection electrode or the reflection layer may be formed of aluminum-palladium-copper (APC) alloy.

An emitting material layer (EML) 640 emitting white light is formed on the first electrode 630. The EML 640 includes a first QD layer including a first QD 641, a second QD layer including a second QD 643, a third QD layer including a third QD 645, a first protection layer including a first organic compound 647 and a second protection layer including a second organic compound 649. The second QD layer is positioned over the first QD layer, and the third QD layer is positioned over the second QD layer. The first protection layer is positioned between the first and second QD layers, and the second protection layer is positioned between the second and third QD layers.

One of the first to third QDs 641, 643 and 645 is a red QD, another one of the first to third QDs 641, 643 and 645 is a green QD, and the other one of the first to third QDs 641, 643 and 645 is a blue QD.

Each of the first and second organic compounds 647 and 649 includes at least two thiol groups. For example, each of the first and second organic compounds 647 and 649 may be selected from the materials of Formula 1. One of the thiol groups in the first organic compound 647 is anchored to the first QD 641, and one of the thiol groups in the second organic compound 649 is anchored to the second QD 643. In addition, another one of the thiol groups in the first organic compound 647 may be anchored to the second QD 643, and another one of the thiol groups in the second organic compound 649 may be anchored to the third QD 645.

As mentioned above, since the damage on the first to third QDs 641, 643 and 645 by moisture and/or oxygen is prevented by the first and second protection layers, the damage and the light efficiency decrease of the first to third QDs 641, 643 and 645 are prevented.

In addition, the damages on the first QD layer and the second QD layer by the solvent for forming the second QD layer and the third QD layer are prevented by the first and second protection layers.

In the white QLED, a first emitting part (stack) including a red QD layer, a second emitting part including a green QD layer and a third emitting part including a blue QD layer are separately included, and a charge generation layer is required between adjacent emitting parts. For example, when a green QD layer is formed directly on a red QD layer, the red QD layer is damaged by a non-polar solvent in a QD composition for forming the green QD layer. To prevent the above damage, the red, green and blue QD layers are separately formed. As a result, the fabricating process of the QLED is complicated, and the thickness and the production costs of the QLED are increased.

However, in the QLED of the present disclosure, since the first and second QD layers are protected by the first and second protection layers, the first to third QD layers can be formed in a single EML. Accordingly, the above problems are prevented.

A second electrode 650 is formed over the first substrate 610 including the EML 640. The second electrode 650 is positioned at an entire surface of the display area. The second electrode 650 may be a cathode and may be formed of a conductive material having a relatively low work function. For example, the second electrode 650 may be formed of aluminum (Al), magnesium (Mg) or Al-Mg alloy. The second electrode 650 has a relatively thin profile to be transparent (semi-transparent).

The first electrode 630, the EML 640 and the second electrode 650 constitute the QLED D.

Although not shown, the QLED D may further include a hole auxiliary layer including at least one of an HIL and an HTL and an electron auxiliary layer including at least one of an ETL and an EIL. The HIL and the HTL may be sequentially disposed between the first electrode 630 and the EML 640, and the ETL and the EIL may be sequentially disposed between the EML 640 and the second electrode 650.

The color filter layer 670 on or over the QLED D includes a red color filter 672 corresponding to the first pixel region P1, i.e., the red pixel region, a green color filter 674 corresponding to the second pixel region P2, i.e., the green pixel region, and a blue color filter 676 corresponding to the third pixel region P3, i.e., the blue pixel region.

The second substrate 660, on which the color filter layer 670 is formed, may be attached to the first substrate 610, on which the QLED D is formed, by an adhesive layer (not shown).

In FIG. 11, the color filter layer 670 is formed on the second substrate 660. Alternatively, the color filter layer 670 may be formed directly on the QLED D. When the light from the QLED D passes through the first substrate 610, i.e., a bottom-emission type QLED, the color filter layer 670 may be positioned between the first substrate 610 and the QLED D.

Figure 12:
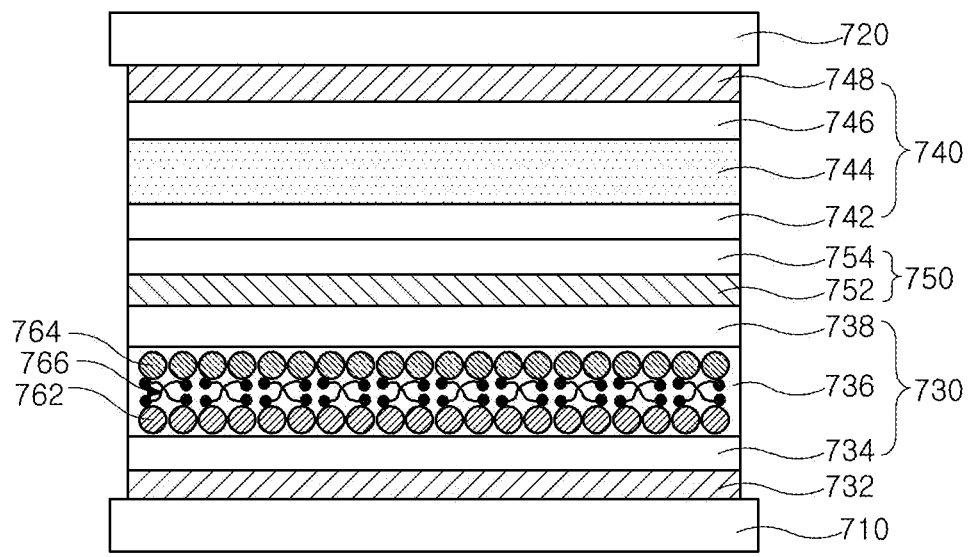
FIG. 12 is a schematic cross-sectional view of a QLED according to a seventh aspect of the present disclosure.

FIG. 12 is a schematic cross-sectional view of a QLED according to a seventh aspect of the present disclosure.

As shown in FIG. 12, a QLED 760 includes a first electrode 710, a second electrode 720 facing the first electrode 710, a first emitting part 730, a second emitting part 740 and a charge generation layer (CGL) 750. The first emitting part 730 is positioned between the first and second electrodes 710 and 720 and includes a first EML 736 including a QD. The second emitting part 740 is positioned between the first emitting part 730 and the second electrode 720 and includes a second EML 744. The CGL 750 is positioned between the first and second emitting parts 730 and 740.

For example, the first electrode 710 may be an anode, and the second electrode 720 may be a cathode.

The first EML 736 includes a first QD layer, a second QD layer over the first QD layer and a first protection layer between the first and second QD layers. The first QD layer includes a first QD 762, and the second QD layer includes a second QD 764. The first protection layer includes a first organic compound 766. Although not shown, the first EML 736 may further include a second protection layer including a second organic compound on the second QD layer.

The first emitting part 730 may further include a hole injection layer (HIL) 732, a first hole transporting layer (HTL) 734 and a first electron transporting layer (ETL) 738. The HIL 732 and the first HTL 734 are sequentially stacked on the first electrode 710, and the first ETL 738 is positioned between the first EML 736 and the CGL 750. At least one of the HIL 732, the first HTL 734 and the first ETL 738 may be omitted.

The first organic compound 766 may be selected from the materials of Formula 1. Namely, the first organic compound 766 includes at least two thiol groups. One of the thiol groups in the first organic compound 766 is anchored to the first QD 762. The other one of the thiol groups in the first organic compound 766 may be anchored to the second QD 764.

The second EML 744 includes an emitting material. The emitting material of the second EML 744 is selected from a fluorescent compound, a phosphorescent compound, a delayed fluorescent compound and a QD.

The second emitting part 740 may further include a second HTL 742, a second ETL 746 and an electron injection layer (EIL) 748. The second HTL 742 is positioned between the CGL 740 and the second EML 744, and the second ETL and the EIL 746 and 748 are sequentially stacked on the second EML 744. At least one of the second HTL 742, the second ETL 746 and the EIL 748 may be omitted.

The CGL 750 is positioned between the first and second emitting parts 730 and 740 such that the first emitting part 730, the CGL 750 and the second emitting part 760 are sequentially stacked on the first electrode 710. The first and second emitting parts 730 and 740 are connected by the CGL 750. The CGL 750 may be a P-N junction type CGL including an N-type CGL 752 and a P-type CGL 754.

The N-type CGL 752 is positioned between the first ETL 738 and the second HTL 742, and the P-type CGL 754 is positioned between the N-type CGL 752 and the second HTL 742.

The CGL 750 generates a charge or separates a charge into a hole and an electron such that the electron and the hole are provided into the first and second emitting parts 730 and 740, respectively.

The N-type CGL 752 provides the electron into the first ETL 738 of the first emitting part 730, and the first ETL 738 provide the electron into the first EML 736 of the first emitting part 730. On the other hand, the P-type CGL 754 provide the hole into the second HTL 742 of the second emitting part 740, and the second HTL 742 provide the hole into the second EML 744 of the second emitting part 740. Accordingly, the emitting efficiency of the QLED 760 including the first and second EMLs 736 and 744 is improved, and the driving voltage of the QLED 760 is reduced.

One of the first QD 762, the second QD 764 and the emitting material of the second EML 744 emits red light, and another one of the first QD 762, the second QD 764 and the emitting material of the second EML 744 emits green light, and the other one of the first QD 762, the second QD 764 and the emitting material of the second EML 744 emits blue light. Accordingly, the QLED 760 provides white light.

The QLED 760 in FIG. 12 may be included in the QD display device 600 in FIG. 11 instead of the QLED D.

Figure 13:
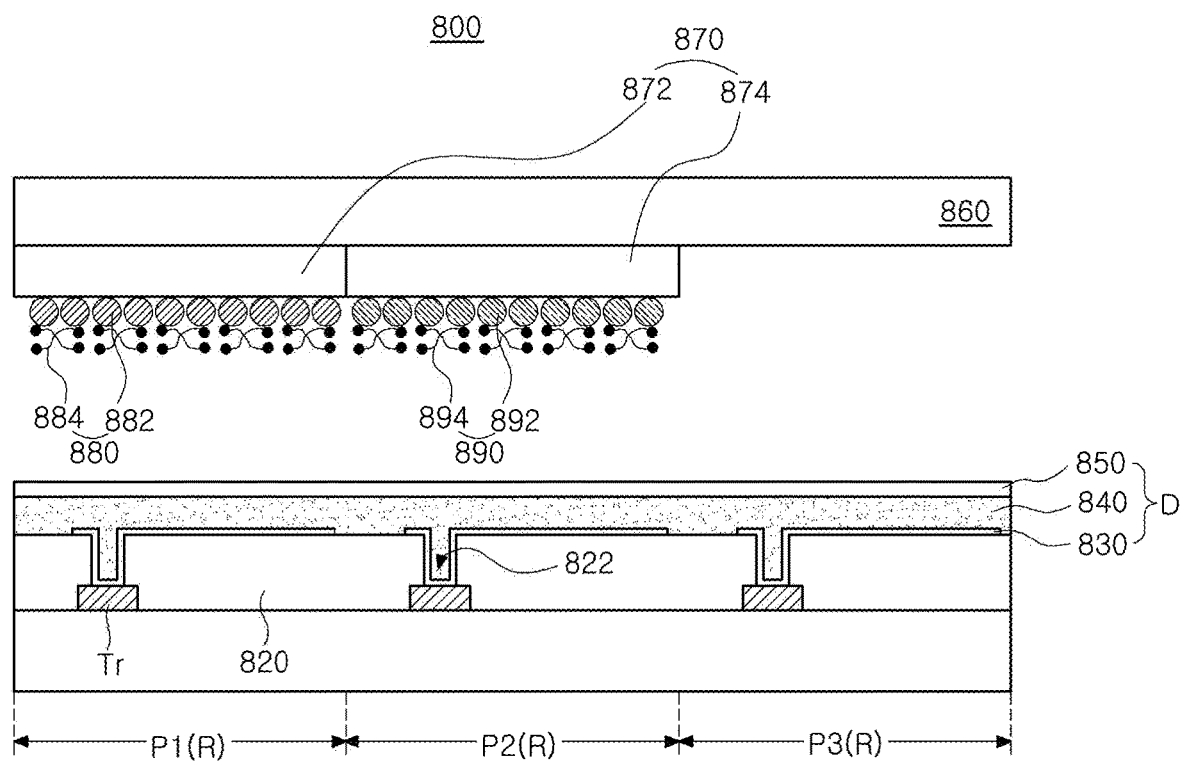
FIG. 13 is a schematic cross-sectional view of a display device according to an eighth aspect of the present disclosure.

FIG. 13 is a schematic cross-sectional view of a display device according to an eighth aspect of the present disclosure.

As shown in FIG. 13, a display device 800 includes a first substrate 810, where first to third pixel regions P1 to P3 are defined, an emitting diode D over the first substrate 810, a color filter layer 870 over the emitting diode D, a first color conversion layer 880 between the emitting diode D and the color filter layer 870 in the first pixel region P1, and second color conversion layer 890 between the emitting diode D and the color filter layer 870 in the second pixel region P2. For example, the first pixel region P1 is a red pixel region R, the second pixel region P2 is a green pixel region G, and the third pixel region P3 is a blue pixel region B.

The QD display device 800 may further include a TFT Tr, which is positioned between the first substrate 810 and the emitting diode D and connected to the emitting diode D, and a second substrate 860 at an outer side of the color filter layer 870. In this instance, the color filter layer 870 may be formed on an inner surface of the second substrate 860.

Although not shown, the TFT Tr includes a semiconductor layer, a gate electrode, a source electrode and a drain electrode.

An insulating layer 820, which includes a drain contact hole 822 exposing the drain electrode, is formed on the TFT Tr. For example, the insulating layer 820 may be formed of an inorganic insulating material or an organic insulating material.

A first electrode 830, which is connected to the drain electrode of the TFT Tr through the drain contact hole 822, is separately formed in each of the first to third pixel regions P1 to P3 and on the insulating layer 820. The first electrode 830 may be an anode and may be formed of a conductive material having a relatively high work function. For example, the first electrode 830 may be formed of a transparent conductive material such as indium-tin-oxide (ITO) or indium-zinc-oxide (IZO).

Although not shown, a reflection electrode or a reflection layer may be formed under the first electrode 830. For example, the reflection electrode or the reflection layer may be formed of aluminum-palladium-copper (APC) alloy.

An emitting material layer (EML) 840 emitting white light is formed on the first electrode 830. An emitting material in the EML 840 is one of a fluorescent compound, a phosphorescent compound, a delayed fluorescent compound and a QD and emits white light.

A second electrode 850 is formed over the first substrate 810 including the EML 840. The second electrode 850 is positioned at an entire surface of the display area. The second electrode 850 may be a cathode and may be formed of a conductive material having a relatively low work function. For example, the second electrode 850 may be formed of aluminum (Al), magnesium (Mg) or Al-Mg alloy. The second electrode 850 has a relatively thin profile to be transparent (semi-transparent).

The first electrode 830, the EML 840 and the second electrode 850 constitute the emitting diode D.

Although not shown, the emitting diode D may further include a hole auxiliary layer including at least one of an HIL and an HTL and an electron auxiliary layer including at least one of an ETL and an EIL. The HIL and the HTL may be sequentially disposed between the first electrode 830 and the EML 840, and the ETL and the EIL may be sequentially disposed between the EML 840 and the second electrode 850.

The color filter layer 870 on or over the emitting D includes a red color filter 872 corresponding to the first pixel region P1, i.e., the red pixel region R and a green color filter 874 corresponding to the second pixel region P2, i.e., the green pixel region G.

The first color conversion layer 880, which is positioned between the red color filter pattern 872 and the emitting diode D in the first pixel region P1, includes a first QD layer and a first protection layer on the first QD layer. The first QD layer includes a first QD 882. The first protection layer is positioned between the first QD layer and the emitting diode D and includes a first organic compound 884.

The second color conversion layer 890, which is positioned between the green color filter pattern 874 and the emitting diode D in the second pixel region P2, includes a second QD layer and a second protection layer on the second QD layer. The second QD layer includes a second QD 892. The second protection layer is positioned between the second QD layer and the emitting diode D and includes a second organic compound 894.

The first QD 882 is a red QD. A part of the blue light from the emitting diode D in the first pixel region P1 is converted into red light by the first QD 882, and the rest of the blue light from the emitting diode D in the first pixel region P1 is absorbed by the red color filter pattern 872. As a result, the red light having high color purity is provided from the first pixel region P1.

The second QD 892 is a green QD. A part of the blue light from the emitting diode D in the second pixel region P2 is converted into green light by the second QD 892, and the rest of the blue light from the emitting diode D in the second pixel region P2 is absorbed by the green color filter pattern 874. As a result, the green light having high color purity is provided from the second pixel region P2.

Each of the first and second organic compounds 884 and 894 includes at least two thiol groups. For example, each of the first and second organic compounds 884 and 894 may be selected from the materials of Formula 1. One of the thiol groups in the first organic compound 884 is anchored to the first QD 882, and one of the thiol groups in the second organic compound 894 is anchored to the second QD 892.

In FIG. 13, each of the first and second color conversion layers 880 and 890 includes a single-layered QD layer. Alternatively, each of the first and second color conversion layers 880 and 890 may include at least two QD layers. In this instance, a protection layer may be formed between adjacent QD layers, and the QDs in each of the first and second color conversion layers 880 and 890 emit the same color light.

The second substrate 860, on which the color filter layer 870 and the first and second color conversion layers 880 and 890 are formed, may be attached to the first substrate 810, on which the emitting diode D is formed, by an adhesive layer (not shown).

In FIG. 13, the color filter layer 870 and the first and second color conversion layers 880 and 890 are formed on the second substrate 860. Alternatively, the first and second color conversion layers 880 and 890 may be formed directly on the emitting diode D, and the color filter 870 may be formed directly on the first and second color conversion layers 880 and 890. When the light from the emitting diode D passes through the first substrate 810, i.e., a bottom-emission type QLED, the color filter layer 870 and the first and second color conversion layers 880 and 890 may be positioned between the first substrate 810 and the emitting diode D.

When white light is emitted from the emitting diode D, a blue color filter pattern and a third color conversion layer, which includes a blue QD and a protection layer, may be formed in the third pixel region P3, i.e., the blue pixel region.

It will be apparent to those skilled in the art that various modifications and variations can be made in the aspects of the disclosure without departing from the spirit or scope of the disclosure. Thus, it is intended that the present disclosure covers the modifications and variations of this disclosure provided they come within the scope of the appended claims and their equivalents.

What is claimed is:

1. A quantum-dot (QD) film, comprising:
   a first QD layer including a plurality of first QDs; and
   a first protection layer disposed on the first QD layer and including a first organic compound,
   wherein the first organic compound includes at least two thiol groups, and
   wherein a first one of the at least two thiol groups is anchored to a first one of the plurality of first QDs, and a second one of the at least two thiol groups is anchored to a second one of the plurality of first QDs.

2. The QD film according to claim 1, wherein the at least two thiol groups in the first organic compound is connected to each other by an ether group or an ester group.

3. The QD film according to claim 2, wherein the first organic compound is selected from the group consisting of following materials:

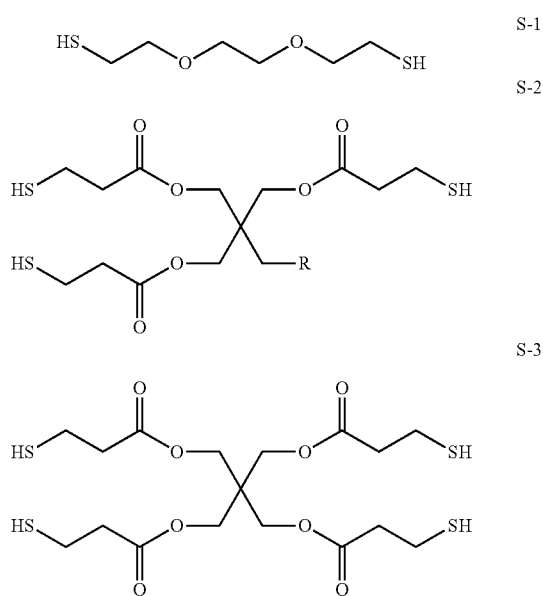

wherein R is selected from C1 to C30 alkyl group.

4. The QD film according to claim 1, further comprising a second QD layer disposed on the first protection layer and including a second QD.

5. The QD film according to claim 4, wherein a third one of the at least two thiol groups is anchored to the second QD.

6. The QD film according to claim 4, further comprising:
   a second protection layer disposed on the second QD layer and including a second organic compound,
   wherein the second organic compound includes at least two thiol groups, and a first one of the at least two thiol groups in the second organic compound is anchored to the second QD.

7. The QD film according to claim 4, wherein light emitted from the first QD and light emitted from the second QD are same or different with each other.

8. A light emitting diode (LED) package, comprising:
   an LED chip; and
   a QD film covering the LED chip, the QD film including a first QD layer including a plurality of first QDs, and a first protection layer on the first QD layer and including a first organic compound,
   wherein the first organic compound includes at least two thiol groups, and
   wherein a first one of the at least two thiol groups is anchored to a first one of the plurality of first QDs, and a second one of the at least two thiol groups is anchored to a second one of the plurality of first QDs.

9. A liquid crystal display device, comprising:
   a liquid crystal panel; and
   an LED package positioned under the liquid crystal panel and including an LED chip and a QD film covering the LED chip,
   wherein the QD film including a first QD layer including a plurality of first QDs, and a first protection layer on the first QD layer and including a first organic compound, and
   wherein the first organic compound includes at least two thiol groups, and
   wherein a first one of the at least two thiol groups is anchored to a first one of the plurality of first QDs, and a second one of the at least two thiol groups is anchored to a second one of the plurality of first QDs.

10. A liquid crystal display device, comprising:
a liquid crystal panel;
a backlight unit positioned under the liquid crystal panel and including a light source; and
a QD film positioned between the liquid crystal panel and the backlight unit, the QD film including:
a first QD layer including a plurality of first QDs; and
a first protection layer on the first QD layer and including a first organic compound,
wherein the first organic compound includes at least two thiol groups, and
wherein a first one of the at least two thiol groups is anchored to a first one of the plurality of first QDs, and a second one of the at least two thiol groups is anchored to a second one of the plurality of first QDs.

11. A QD light emitting diode, comprising:
a first electrode;
a second electrode facing the first electrode; and
a first emitting material layer positioned between the first and second electrodes and including a first QD layer includes a plurality of first QDs and a first protection layer on the first QD layer,
wherein the first protection layer includes a first organic compound,
wherein the first organic compound includes at least two thiol groups, and
wherein a first one of the at least two thiol groups is anchored to a first one of the plurality of first QDs, and a second one of the at least two thiol groups is anchored to a second one of the plurality of first QDs.

12. The QD light emitting diode according to claim 11, wherein the at least two thiol groups in the first organic compound is connected to each other by an ether group or an ester group.

13. The QD light emitting diode according to claim 12, wherein the first organic compound is selected from the group consisting of following materials:

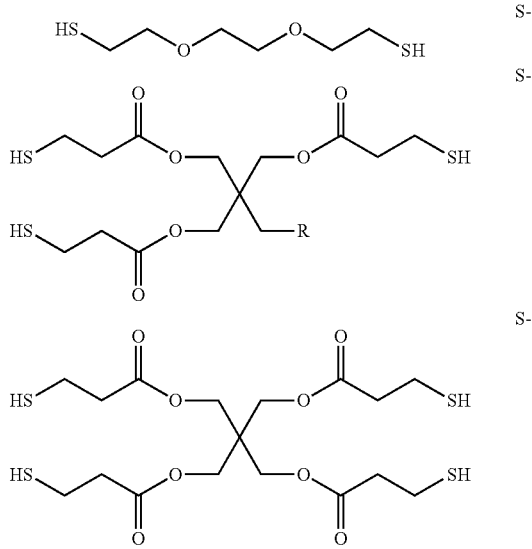

wherein R is selected from C1 to C30 alkyl group.

14. The QD light emitting diode according to claim 11, wherein the first emitting material layer further includes a second QD layer on the first protection layer and including a second QD.

15. The QD light emitting diode according to claim 14, wherein a third one of the at least two thiol groups is anchored to the second QD.

16. The QD light emitting diode according to claim 14, wherein light emitted from the first QD and light emitted from the second QD are same or different.

17. The QD light emitting diode according to claim 14, wherein the first emitting material layer further includes a second protection layer on the second QD layer and including a second organic compound, and
wherein the second organic compound includes at least two thiol groups, and a first one of the at least two thiol groups in the second organic compound is anchored to the second QD.

18. The QD light emitting diode according to claim 17, wherein the first emitting material layer further includes a third QD layer on the second protection layer and including a third QD.

19. The QD light emitting diode according to claim 18, wherein one of the first to third QDs is a red QD, and another one of the first to third QDs is a green QD, and
wherein the other one of the first to third QDs is a blue QD.

20. The QD light emitting diode according to claim 14, further comprising:
a second emitting material layer positioned between the first emitting material layer and the second electrode and including an emitting material; and
a charge generation layer positioned between the first and second emitting material layers,
wherein one of the first QD, the second QD and the emitting material emits a red light, and another one of the first QD, the second QD and the emitting material emits a green light, and
wherein the other one of the first QD, the second QD and the emitting material emits a blue light.

21. A display device, comprising:
a substrate;
a QD light emitting diode positioned over the substrate and including a first electrode, a second electrode facing the first electrode, and a first emitting material layer positioned between the first and second electrodes and including a first QD layer having a plurality of first QDs and a first protection layer on the first QD layer; and
a thin film transistor positioned between the substrate and the QD light emitting diode and connected to the QD light emitting diode,
wherein the first protection layer includes a first organic compound,
wherein the first organic compound includes at least two thiol groups, and
wherein a first one of the at least two thiol groups is anchored to a first one of the plurality of first QDs, and a second one of the at least two thiol groups is anchored to a second one of the plurality of first QDs.

22. The display device according to claim 21, wherein the first emitting material layer further includes a second QD layer on the first protection layer and including a second QD, a second protection layer on the second QD layer and including a second organic compound, and a third QD layer on the second protection layer and including a third QD,
wherein the second organic compound includes at least two thiol groups, and a first one of the at least two thiol groups in the second organic compound is anchored to the second QD, wherein one of the first to third QDs is a red QD, and another one of the first to third QDs is a green QD, and wherein the other one of the first to third QDs is a blue QD.

23. The display device according to claim 22, further comprising a color filter layer positioned between the substrate and the QD light emitting diode or over the QD light emitting diode.

24. The display device according to claim 21, wherein the first emitting material layer further includes a second QD layer on the first protection layer and including a second QD,
wherein the QD light emitting diode further includes a second emitting material layer positioned between the first emitting material layer and the second electrode and including an emitting material and a charge generation layer positioned between the first and second emitting material layers,
wherein one of the first QD, the second QD and the emitting material emits a red light, and another one of the first QD, the second QD and the emitting material emits a green light, and
wherein the other one of the first QD, the second QD and the emitting material emits a blue light.

25. The display device according to claim 24, further comprising a color filter layer positioned between the substrate and the QD light emitting diode or over the QD light emitting diode.

26. A display device, comprising:
a substrate including first to third pixel regions;
an emitting diode over the substrate;
a color filter layer positioned over the emitting diode and including a first color filter pattern in the first pixel region; and
a first color conversion layer positioned between the first color filter pattern and the emitting diode in the first pixel region and including a first QD layer and a first protection layer on the first QD layer,
wherein the first QD layer includes a first QD, and the first protection layer includes a first organic compound,
wherein the first organic compound includes at least two thiol groups, and
wherein a first one of the at least two thiol groups is anchored to a first one of the plurality of first QDs, and a second one of the at least two thiol groups is anchored to a second one of the plurality of first QDs.

27. The display device according to claim 26, further comprising a second color conversion layer positioned in the second pixel region and including a second QD layer and a second protection layer on the second QD layer,
wherein the second QD layer includes a second QD, and the second protection layer includes a second organic compound,
wherein the second organic compound includes at least two thiol groups, and one of the at least two thiol groups in the second organic compound is anchored to the second QD, and
wherein the color filter layer further includes a second color filter pattern in the second pixel region, and the second color conversion layer is positioned between the second color filter pattern and the emitting diode in the second pixel region.

28. The display device according to claim 27, wherein one of the first and second pixel regions is a red pixel region, and the other one of the first and second pixel regions is a green pixel region.

29. The display device according to claim 28, wherein the emitting diode emits a blue light.

30. The display device according to claim 26, further comprising: a third color conversion layer positioned in the third pixel region and including a third QD layer and a third protection layer on the third QD layer,
wherein the third QD layer includes a third QD, and the third protection layer includes a third organic compound,
wherein the third organic compound includes at least two thiol groups, and one of the at least two thiol groups in the third organic compound is anchored to the third QD,
wherein the color filter layer further includes a third color filter pattern in the third pixel region, and the third color conversion layer is positioned between the third color filter pattern and the emitting diode in the third pixel region, and
wherein the emitting diode emits a white light.

31. The display device according to claim 26, wherein the at least two thiol groups in the first organic compound is connected to each other by an ether group or an ester group.

32. The display device according to claim 26, wherein the first organic compound is selected from the group consisting of following materials:

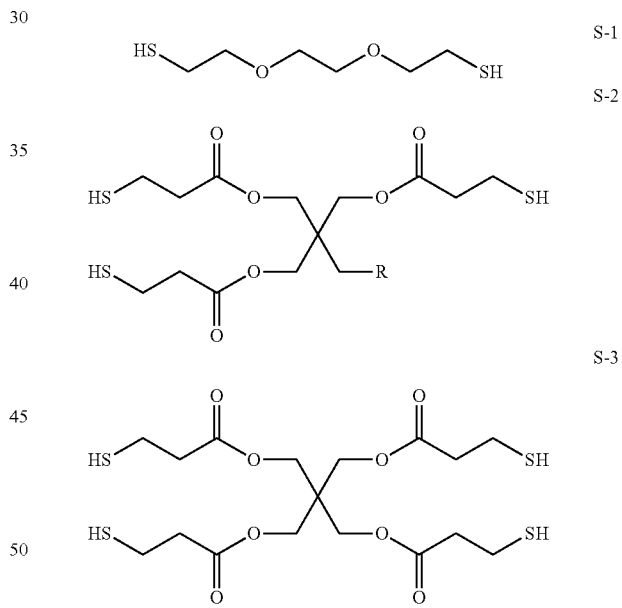

wherein R is selected from C1 to C30 alkyl group.

33. The QD film according to claim 1, wherein the first organic compound is

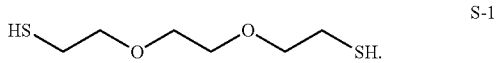

* * * * *